United States Patent [19]
Sung

[11] Patent Number: 6,040,216
[45] Date of Patent: Mar. 21, 2000

[54] METHOD (AND DEVICE) FOR PRODUCING TUNNEL SILICON OXYNITRIDE LAYER

[75] Inventor: Kuo-Tung Sung, Hsinchu, Taiwan

[73] Assignee: Mosel Vitelic, Inc., Hsinchu, Taiwan

[21] Appl. No.: 09/019,431

[22] Filed: Feb. 5, 1998

[30] Foreign Application Priority Data

Aug. 11, 1997 [TW] Taiwan ................................. 86111486

[51] Int. Cl.[7] .................................................. H01L 21/336
[52] U.S. Cl. ............................ 438/257; 438/258; 438/264
[58] Field of Search ............................ 257/315; 438/257, 438/258, 275, 152, 264

[56] References Cited

U.S. PATENT DOCUMENTS

| | | | |
|---|---|---|---|
| Re. 35,094 | 11/1995 | Wu et al. ................................... | 437/43 |
| 5,066,992 | 11/1991 | Wu et al. ................................ | 357/23.5 |
| 5,202,850 | 4/1993 | Jenq ........................................ | 365/185 |
| 5,278,087 | 1/1994 | Jenq ........................................ | 437/43 |
| 5,376,573 | 12/1994 | Richart et al. ............................ | 437/48 |
| 5,401,992 | 3/1995 | Ono ........................................ | 257/315 |
| 5,403,759 | 4/1995 | Havemann ............................... | 438/152 |
| 5,440,159 | 8/1995 | Larsen et al. ............................ | 257/318 |
| 5,482,879 | 1/1996 | Hong ....................................... | 437/43 |
| 5,493,534 | 2/1996 | Mok ........................................ | 365/226 |
| 5,587,332 | 12/1996 | Chang et al. ............................. | 438/258 |
| 5,587,951 | 12/1996 | Jazayeri et al. .......................... | 365/203 |
| 5,606,532 | 2/1997 | Lambrache et al. ................... | 365/238.5 |
| 5,680,346 | 10/1997 | Pathak et al. ......................... | 365/185.1 |
| 5,691,212 | 11/1997 | Tsai et al. ................................. | 437/24 |
| 5,879,990 | 3/1999 | Dormans et al. ........................ | 438/257 |
| 5,888,869 | 3/1999 | Cho et al. ................................ | 438/275 |

OTHER PUBLICATIONS

Stanley Wolf, Ph.D., *Silicon Processing for the VLSI Era*, vol. II: *Process Integration*, (1990), Lattice Press, pp. 634–635.

*Primary Examiner*—John F. Niebling
*Assistant Examiner*—Walter L. Lindsay, Jr.
*Attorney, Agent, or Firm*—Townsend and Townsend and Crew LLP

[57] ABSTRACT

A novel method of fabricating a flash memory cell. The present method includes a step of providing a semiconductor substrate (101) having a first active region (111), a second active region (109), and an isolation region (103). The isolation region is defined between the first active region and second active region. The process undergoes a step of masking (105) a portion of the isolation region and the second active region, and introducing (107) a nitrogen bearing impurity by implantation into a surface of the active region. The method also includes removing the portion being masked, e.g., stripping. A step of forming a silicon oxynitride layer (117) from the nitrogen bearing impurity on the surface of the first active region and forming silicon dioxide (115) on the second active region is included.

17 Claims, 5 Drawing Sheets

METHOD (AND DEVICE) FOR PRODUCING TUNNEL SILICON OXYNITRIDE LAYER

BACKGROUND OF THE INVENTION

The present invention relates to the manufacture of semiconductor integrated circuits. More particularly, the invention is illustrated with regard to memory cell structures for a flash memory cell or flash E$^2$PROM or EPROM cell, but it will be recognized that the invention has a wider range of applicability. Merely by way of example, the present invention can be applied to a variety of embedded memory cell structures such as microprocessors ("MICROs"), microcontrollers, application specific integrated circuits ("ASICs"), and the like.

A variety of memory devices have been proposed or used in industry. An example of such a memory device is an erasable programmable read-only memory ("EPROM") device. The EPROM device is both readable and erasable, i.e., programmable. In particular, an EPROM is implemented using a floating gate field effect transistor, which has binary states. That is, a binary state is represented by the presence of absence of charge on the floating gate. The charge is generally sufficient to prevent conduction even when a normal high signal is applied to the gate of the EPROM transistor.

Numerous varieties of EPROMs are available. In the traditional and most basic form, EPROMs are programmed electrically and erased by exposure to ultraviolet light. These EPROMs are commonly referred to as ultraviolet erasable programmable read-only memories ("UVEPROM"s). UVEPROMs can be programmed by running a high current between a drain and a source of the UVEPROM transistor while applying a positive potential to the gate. The positive potential on the gate attracts energetic (i.e., hot) electrons from the drain-to-source current, where the electrons jump or inject into the floating gate and become trapped on the floating gate.

Another form of EPROM is the electrically erasable programmable read-only memory ("EEPROM" or "E$^2$PROM"). EEPROMs are often programmed and erased electrically by way of a phenomenon known as a Fowler-Nordheim tunneling process. Still another form of EPROM is a "Flash EPROM," which is programmed using hot electrons and erased using the Fowler-Nordheim tunneling phenomenon. Flash EPROMs can be erased in a "flash" or bulk mode in which all cells in an array or a portion of an array can be erased simultaneously using Fowler-Nordheim tunneling, and are commonly called "Flash cells" or "Flash devices."

A limitation with flash memory devices is the oxide layer or "tunnel oxide" layer must be high quality to accept repeated programing of the floating gate. High quality oxide is often formed by way of thermal oxidation. However, high quality oxide simply does not have sufficient qualities for higher density or sub-micron sized device structures. Accordingly, nitridized layers have been proposed to replace high quality oxide layers. Unfortunately, the thermal processing techniques used for nitridized layers often cause irregularities, including irregular gate oxide thickness, by way of a phenomenon known as the "Kooi" effect. Such irregularities are generally undesirable in the fabrication of integrated circuits.

From the above, it is seen that an improved flash memory cell structure that is easy to fabricate, cost effective, and reliable is often desired.

SUMMARY OF THE INVENTION

The present invention provides a technique, including a method and structure, for an improved floating gate structure for a flash memory cell in an integrated circuit device. In an exemplary embodiment, the present invention provides, for example, a method of introducing nitrogen bearing impurities (or compounds) into a region which will be the tunneling layer, e.g., tunnel silicon oxynitride.

In a specific embodiment, the present invention provides a novel method of fabricating a flash memory cell. The present method includes a step of providing a semiconductor substrate having a first active region, a second active region, and an isolation region. In a specific embodiment, the first active region corresponds to a flash memory cell region, and the second active region corresponds to an MOS or CMOS device region. The isolation region is defined between the first active region and second active region. The process undergoes a step of masking a portion of the isolation region and the second active region, and introducing a nitrogen bearing impurity by implantation into a surface of the active region. The method also includes removing the portion being masked, e.g., stripping. A step of forming a silicon oxynitride layer from the nitrogen bearing impurity on the surface of the first active region and forming silicon dioxide on the second active region is included. The second active region has silicon dioxide which is substantially free from nitride by way of masking. Accordingly, the second active region has a high quality oxide layer for the formation of CMOS devices. The present method also provides a variety of novel partially integrated device structures, which will be described in more detail below.

Numerous benefits are achieved in one or more embodiments of the present invention over previous existing techniques. In a specific embodiment, the present invention provides a relatively easy to use technique to selectively introduce nitrogen bearing impurities into the substrate, which will be used to form a silicon oxynitride layer or tunneling layer for a flash memory device. Other regions of the substrate are substantially free from any nitrogen bearing impurities and therefore are easy to form high quality oxide thereon without a possibility of introducing a Kooi effect of pre-existing techniques. The present invention also uses a relatively simple processing technique, which can readily be applied to the manufacture of integrated circuits using conventional equipment. These and other benefits are described throughout the present specification, and more particularly below.

The present invention achieves these benefits in the context of known process technology. A further understanding of the nature and advantages of the present invention, however, may be realized by reference to the latter portions of the specification and attached drawings.

DESCRIPTION OF THE SPECIFIC EMBODIMENT

I. CONVENTIONAL DEVICE STRUCTURE AND METHOD

Figure 1:
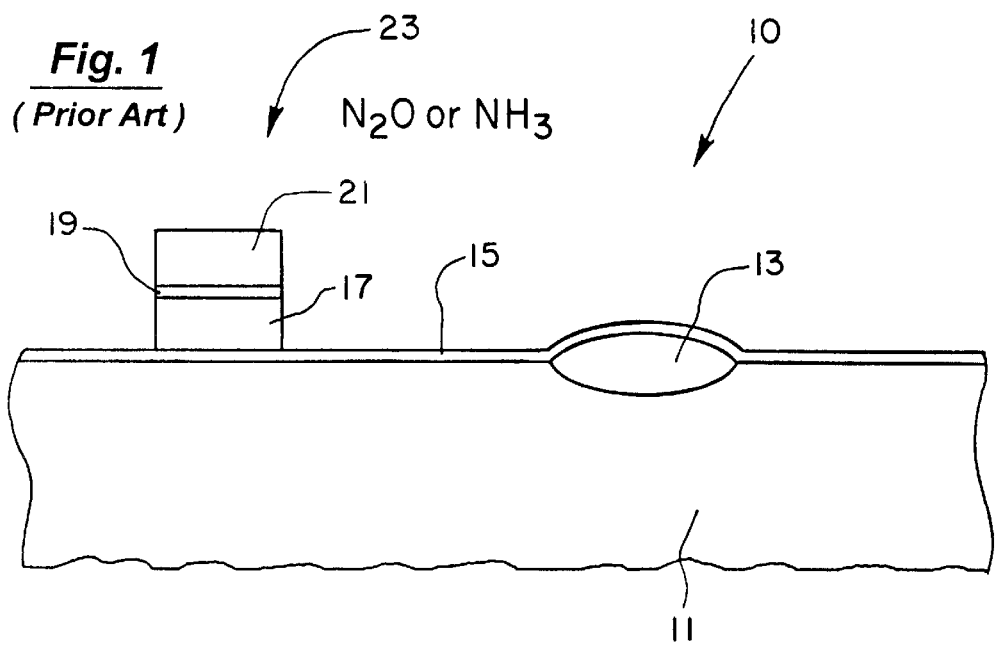
FIGS. 1–2A illustrate a simplified method of forming a conventional flash memory device.
Figure 2:
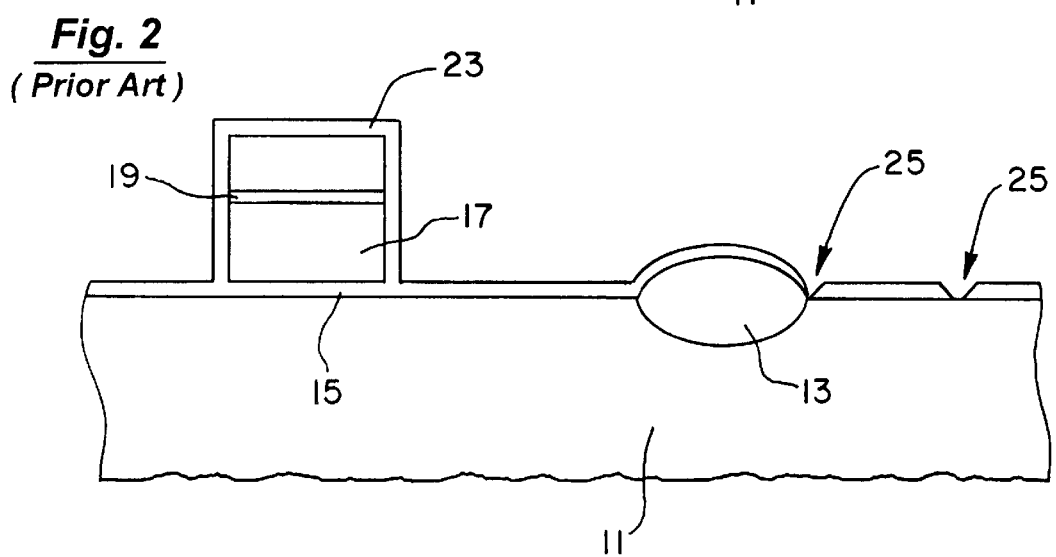
Figure 2A:
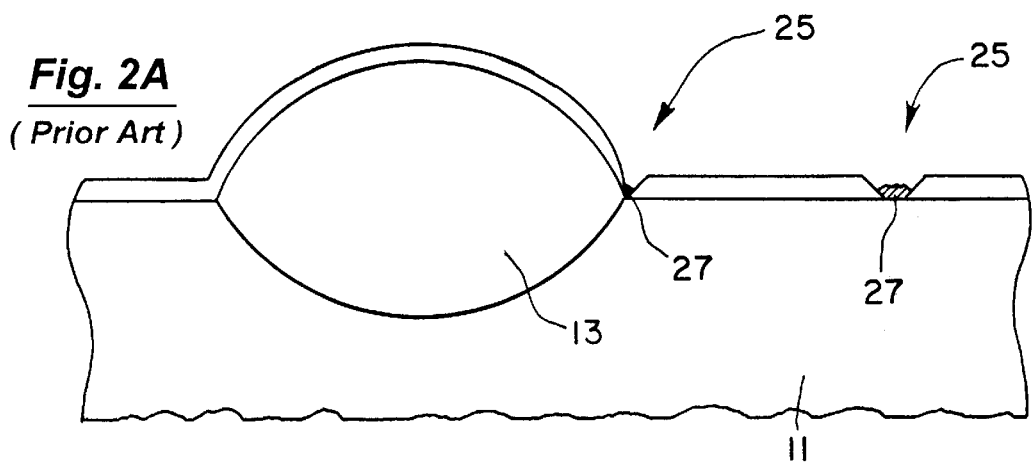

FIGS. 1–2A illustrate a simplified method of forming a conventional flash memory device 10. This method begins by providing a substrate 11. Field isolation oxide regions 13 are defined in the substrate 11 to isolate a memory device 23. A gate structure including a floating gate 17 and a control gate 21 is defined overlying an oxide layer 15, which is defined overlying the substrate 11. Oxide layer 15 is commonly termed the "tunnel oxide" layer, since electrons tunnel through the oxide layer to the floating gate. A dielectric layer 19 is sandwiched between the floating gate 17 and the control gate 21. The dielectric layer 19 includes an oxide layer, which is defined overlying the floating gate. A nitride layer is defined overlying the oxide layer. Another oxide layer is defined overlying the nitride layer. The combination of the two oxide layers and the nitride layer sandwiched in between is commonly called an "ONO" structure. An example of this memory device is one developed by Intel Corporation ("Intel"). Intel called its process FLOTOX (i.e., FLOating gate Tunneling OXide). Other processes are called, for example, FETMOX, SIMOS, etc., which differ slightly from company to company. The general cell structure includes an access transistor and a double polysilicon storage cell with a floating polysilicon gate isolated in silicon dioxide, which is capacitively coupled to a second polysilicon control gate, which is stacked above the floating gate. The memory cell can be used in NMOS, as well as CMOS technology.

The storage cell is erased by Fowler-Nordheim tunneling of electrons. For example, selected voltages are applied to the VDD, VBB, and VPP to inject electrons through the thin oxide layer from the floating gate to the junction. The floating gate thereby becomes relatively more positively charged. This shifts the threshold voltage in the negative direction so that in the READ mode the transistor will be "on." In the program mode the control gate is at a high voltage while a fixed voltage is applied to the drain junction to generate hot electrons. These hot electrons have sufficient energy to overcome the oxide barrier and enter into the floating gate. The threshold voltage thereby shifts in the positive direction so that in the read mode the transistor will be "off." Typically, the erased state corresponds to a logical "1" stored in the cell, and the programmed state corresponds to a logical "0" stored in the cell. Of course, in particular implementations, the reverse notational convention can also be used such that an erased state corresponds to a logical "0" and a programmed state corresponds to a logical "1".

During formation of the tunnel oxide layer, which occurs before the floating gate layer is defined, nitrogen bearing compounds are used to diffuse nitrogen into the oxide layer. The combination of nitrogen and oxygen form silicon oxynitride. Conventional gases used to form silicon oxynitride include nitrogen dioxide or ammonia. Silicon oxynitride formation generally occurs in a high temperature environment such as a diffusion furnace or the like. Although, silicon oxynitride has good dielectric and uniformity characteristics, it has some severe limitations.

For example, conventional silicon oxynitride leaves residual nitrogen bearing impurities or compounds overlying the oxide layer outside the main flash cell region. Residual nitrogen bearing impurities retard oxide growth on silicon in subsequent oxidation processes. In particular, any remaining nitrogen bearing impurities such as silicon nitride retards the formation of oxide in the fabrication of dielectric layer 19, which will be used for a thin film MOS or CMOS transistor. As merely an example, FIG. 2 shows region 25, which has retarded oxide growth caused from silicon nitride residual material overlying the silicon substrate. FIG. 2A shows a more detailed cross-sectional view diagram of FIG. 2. In particular, FIG. 2A illustrates the silicon nitride residual material 27, which retards growth of oxide. This process of reducing oxide grown will create a Kooi effect and degrade the quality of a gate oxide layer which is subsequently formed for an MOS device. Accordingly, it is desirable to remove any residual silicon nitride which may eventually degrade the quality of a gate dielectric layer.

II. PRESENT DEVICE STRUCTURE AND METHOD

Figure 3:
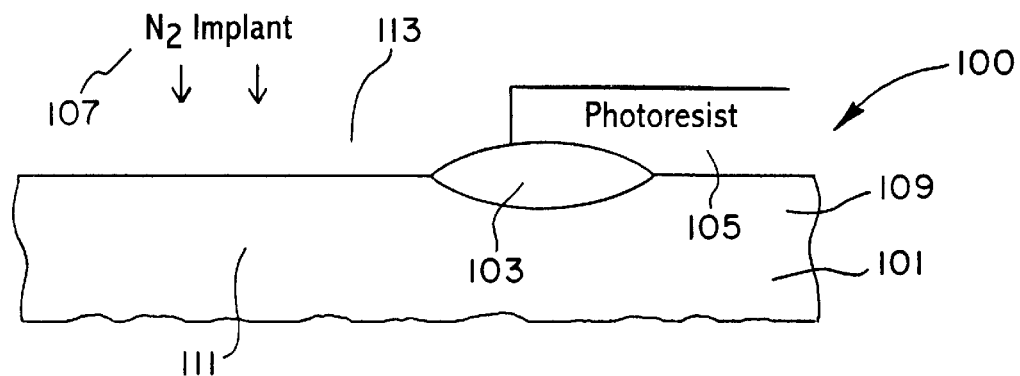
FIGS. 3–5 illustrate a simplified method according to the present invention.
Figure 4:
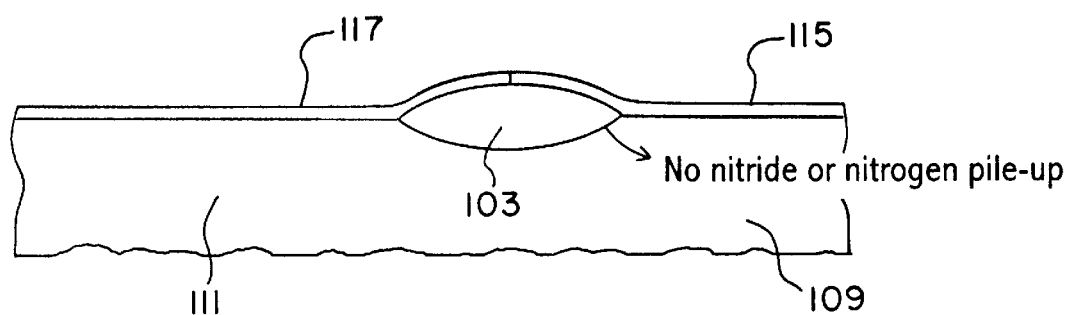
Figure 5:
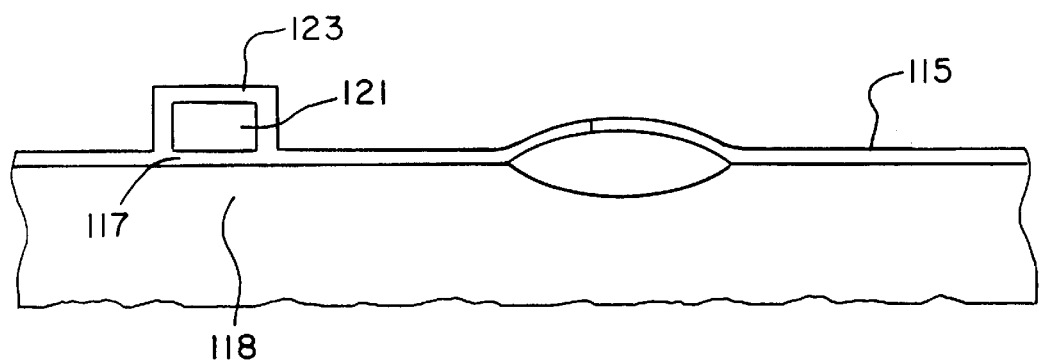

FIGS. 3–5 illustrate a simplified method of forming a flash memory device according to the present invention. These diagrams show merely an example and should not limit the scope of the claims herein. One of ordinary skill in the art would recognize other alternatives, variations, and modifications. The method begins by providing a partially completed semiconductor device 100. The device 100 includes a variety of features such field isolation oxide regions 103, which are used to isolate the active device regions. The field oxide regions form onto the semiconductor substrate by use of a technique known in the art, such as the local oxidization of silicon (LOCOS). In a CMOS embodiment, a P type well region and an N type well region are defined onto the semiconductor substrate, typically separated by the field oxide region. The P type well region and the N type well region define the location for an N type channel device and a P type channel device, respectively. The active regions include main active region 111 for a flash memory device and peripheral region 109 for an MOS transistor or the like. The device may also have a well region 101 such as those described above and others.

To protect region 109, which will be used for the MOS or CMOS transistor, a masking layer 105 is applied. Masking layer 105 can be made of any suitable photoresist layer for selectively protecting region 109 from a step of ion implantation or plasma treatment, which will be used to introduce the nitrogen bearing impurities. Masking steps typically employ spin coating, exposing, and developing to form exposed region 113. Active region 101 is protected from a possibility of any nitrogen bearing impurities, which can influence the quality and reliability of MOS or CMOS transistors being formed thereon.

The ion implantation step 107 (or plasma treatment step) introduces a nitrogen bearing impurity into the surface of the active region 111, which corresponds to the flash memory cell. In some embodiments, nitrogen gas is used as a source for the nitrogen bearing compound. Alternatively, other nitrogen bearing compounds such as NO, $N_2O$, and others can be used, depending upon the application. The nitrogen gas converts into a nitrogen ion, which is accelerated into the surface of the substrate. As merely an example, nitrogen implantation has parameters including a dose ranging from about $10^{13}$ to $10^{15}$ atoms/cm. Power corresponding to this dose can range from about 60 keV and less, or 40 keV and less. Nitrogen ions are preferably introduced into and through a sacrificial oxide layer overlying the substrate. Implant depth ranges from about 80 Angstroms to about 100 Angstroms, but is not limited to this range. Other techniques can also be used to introduce the nitrogen bearing impurity or compound. For example, plasma treatment can be used to introduce nitrogen into the surface of the substrate. After introducing the nitrogen into the substrate, the sacrificial oxide is stripped. Alternatively, the nitrogen is annealed into the substrate with oxygen to form silicon oxynitride or the like, which occurs after removing the photoresist layer. This process forms a layer of tunnel oxide or tunnel oxynitride having a thickness ranging from about 80 to about 100 Angstroms, but is not limited to this range of thicknesses.

The photoresist layer is stripped, as illustrated by FIG. 4. The substrate has active cell region 111 and active peripheral region 109, which may be not in the periphery of the integrated circuit. Active cell region 111 has an overlying layer 117 of silicon oxynitride, which is formed after removing the photoresist. Peripheral region 109 has an overlying oxide layer 115, which can be the sacrificial oxide layer or a cleanly grown oxide layer. Oxide layer 115 is substantially free from any nitrogen bearing compounds since region 109 has been protected by a photomask during the previous step of introducing nitrogen bearing compound or impurity with masking.

A floating gate structure 110 is defined overlying a channel region 118. The floating gate structure can be any suitable material such as polysilicon or the like. The floating gate polysilicon layer is also known as the poly 1 layer and the like. The gate polysilicon layer is often doped with an N type dopant such as phosphorus and the like. Doping can occur using $POCl_3$ diffusion, in-situ doping techniques, and implantation techniques. The gate polysilicon can be formed in a polycrystalline state or an amorphous state, which is later converted into the polycrystalline state.

A dielectric layer 123 is formed overlying the floating gate layer. This dielectric layer can be a single layer or multiple layers, e.g., oxide on nitride on oxide, commonly termed ONO. Using for example an ONO dielectric layer, oxide is formed using a thermal annealing step of steam oxidation to form high quality substantially pin hole free oxide. The nitride layer is formed using a thermal treatment process also. A subsequent oxide layer overlying the nitride layer can be formed using thermal treatment by way of steam oxidation or the like. Of course, the technique used depends upon the application.

A control gate layer is defined overlying the dielectric layer to form a sandwiched gate structure. The control gate layer is preferably a polysilicon layer. The polysilicon layer is generally doped with impurities such as an N-type impurity. The N-type impurity is diffused, implanted, or in-situ doped. In most cases, it is desirable to in-situ dope the impurity into the control gate layer to prevent any possible damage to the dielectric layer. An example of an N-type impurity is phosphorus, arsenic, and others. Alternatively, a lower temperature diffusion process may be used to introduce impurities into the control gate layer.

In addition to those steps described above, LDD implants are made to form N– type and P– type LDD regions. A mask typically of photoresist overlying the top surface of the substrate exposes regions for the N– type LDD implant. The N– type implant forms the N– type LDD regions for an N type channel device. The mask is then stripped by way of standard techniques in the art. Another mask exposes P– type LDD regions for the P– type LDD implant. The P– type implant forms the P– type LDD regions for a P type channel device. The mask is stripped. Source/drain regions are defined in the memory device. An N+ type implant is made to define source/drain regions of the N-type impurity device. A P+ type implant is made to define source/drain regions of the P-type impurity device. To complete the cell structure, the method undergoes steps of applying an inter-dielectric film overlying the surface region of the memory device. Contact regions or vias are made in the inter-dielectric film. Remaining fabrications steps are performed to complete the device.

Figure 6:
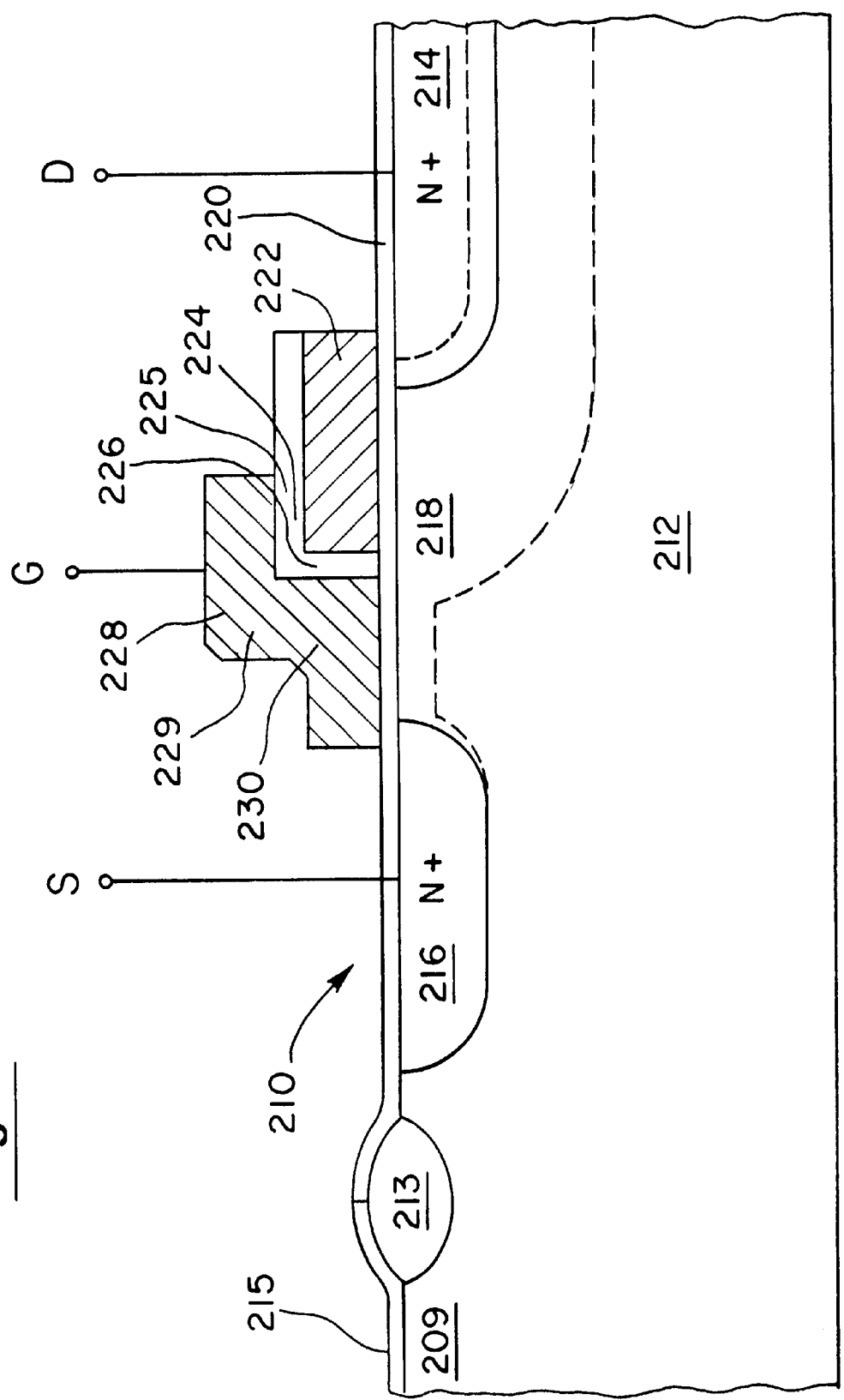
FIGS. 6–10 are simplified diagrams illustrating flash memory cell structures according to specific embodiments of the present invention.

FIG. 6 illustrates an example of a flash memory device according to a specific embodiment of the present invention. Referring to FIG. 6, there is shown a single transistor non-volatile electrically alterable semiconductor memory cell 210. The cell 210 comprises a semiconductor substrate 212, such as silicon. The substrate 212, in one embodiment, can be a P-type silicon substrate with a typical doping level range from 5 to 50 ohm-cm, depending on the level of scaling.

Within the substrate 212 are defined a source region 216 and a drain region 214 with a channel region 218 therebetween. Disposed over the source region 216, channel region 218, and drain region 214 is a first layer 220 of insulating material, on the order of, e.g., 70–200 Angstroms of thickness.

An isolation oxide 213 isolates the memory cell 210 from an active region 209. An oxide layer 215 overlies active region 209. The oxide layer 215 is substantially free from any nitrogen bearing compounds because its underlying active region 209 has been protected according to the present invention by a photomask during a nitrogen-introducing step (e.g., ion implantation or plasma treatment) associated with making the first layer 220, similarly to the process discussed above with reference to previous figures.

In particular, similarly to what was discussed above with reference to previous figures, prior to the nitrogen-introducing step associated with making the first layer 220, a masking layer is applied to cover active region 209 and a portion of the isolation oxide region 213. The masking layer can be made of any suitable photoresist layer for selectively protecting the active region 209 from a step of ion implantation or plasma treatment, which will be used to introduce the nitrogen bearing impurities. Active region 209 is protected from a possibility of any nitrogen bearing impurities, which can influence the quality and reliability of MOS or CMOS transistors being formed thereon.

The ion implantation step (or plasma treatment step) introduces a nitrogen bearing impurity into the surface of the active region 218, which corresponds to the flash memory cell 210. In some embodiments, nitrogen gas is used as a source for the nitrogen bearing compound. Alternatively, other nitrogen bearing compounds such as NO, $N_2O$, and others can be used, depending upon the application. The nitrogen gas converts into a nitrogen ion, which is accelerated into the surface of the substrate. As merely an example, nitrogen implantation has parameters including a dose ranging from about $10^{13}$ to $10^{15}$ atoms/$cm^3$. Power corresponding to this dose can range from about 60 keV and less, or 40 keV and less. Nitrogen ions are preferably introduced into and through a sacrificial oxide layer overlying the substrate. Implant depth ranges from about 80 Angstroms to about 100 Angstroms, but is not limited to this range. Other techniques can also be used to introduce the nitrogen bearing impurity or compound. For example, plasma treatment can be used to introduce nitrogen into the surface of the substrate. After introducing the nitrogen into the substrate, the sacrificial oxide is stripped. Alternatively, the nitrogen is annealed into the substrate with oxygen to form silicon oxynitride or the like, which occurs after removing the photoresist layer. This process forms a layer of tunnel oxide or tunnel oxynitride having a thickness ranging from about 80 to about 100 Angstroms, but is not limited to this range of thicknesses.

The photoresist layer is stripped. The substrate has active cell region 218 and active peripheral region 209, which may be not in the periphery of the integrated circuit. Active cell region 218 has an overlying layer 220 of silicon oxynitride, which is formed after removing the photoresist. At least a portion of peripheral cell region 209 has an overlying oxide layer 215, which can be the sacrificial oxide layer or a cleanly grown oxide layer. Oxide layer 215 is substantially free from any nitrogen bearing compounds since region 209 has been protected by a photomask during the previous step of introducing nitrogen bearing compound or impurity with masking.

Disposed over the first layer 220 is a floating gate 222. The floating gate 222 is positioned over a portion of the channel region 218 and over a portion of the drain region 214. The floating gate 222 can be a polysilicon gate and in one embodiment is a re-crystallized polysilicon gate. A second insulating layer 225 has a first portion 224 disposed over the floating gate 222 and a second portion 226 disposed adjacent to the floating gate 222. The first portion 224 (top wall 224) of the second layer 225 is an insulating material and can be silicon dioxide, silicon nitride or silicon oxynitride and is on the order of, e.g., 1000–3000 Angstrom in thickness. The second portion 226 (side wall 226) of the second layer 225 is also of an insulating material and can be silicon dioxide, silicon nitride or silicon oxynitride and is on the order of, e.g., 150–1200 Angstrom in thickness. A control gate 229 has two portions: A first portion 228 is disposed over the top wall 224 of the second layer 225; a second portion 230 is disposed over the first layer 220 and is immediately adjacent to the side wall 226 of the second layer 225. The second portion 230 of the control gate 229 extends over a portion of the source region 216 and over a portion of the channel region 218.

The dimensions of the cell 210 depend upon the process used. Thus, the foregoing dimensions for the first layer 220, side wall 226, and top wall 224 are only illustrative examples. Further, the material, for the first layer 220 and the second layer 225 are also illustrative examples only. In general, however, the dimensions of the cell 210 are such that electrons emanating from the source region 216 are injected onto the floating gate 222 by sensing an abrupt potential drop. Further, the dimensions of cell 210 are such that charges from the floating gate 222 are removed by tunneling through the Fowler-Nordheim mechanism through, for example, the second layer 225 onto the control gate 229. The particular manner of operating the cell 210 is as follows:

Initially, when it is desired to erase cell 210, a ground potential is applied to the drain 214 and to the source 216. A high-positive voltage, on the order of, e.g., +15 volts, is applied to the control gate 229. Charges on the floating gate 222 are induced through the Fowler-Nordheim tunneling mechanism to tunnel through the second layer 225 to the control gate 229, leaving the floating gate 222 positively charged.

When selective cells 210 are desired to be programmed, a ground potential is applied to the source region 216. A positive voltage level in the vicinity of the threshold voltage of the MOS structure defined by the control gate 229, (on the order of approximately +1 volt, for example), is applied to the control gate 229. A positive high voltage, on the order of, e.g., +12 volts, is applied to the drain region 214. Electrons generated by the source region 216 will flow from the source region 216 towards the drain region 214 through a weakly-inverted channel region 218. When the electrons reach the region where the control gate 229 meets the side wall 226, the electrons see a steep potential difference approximately equal to the drain voltage, across the surface region defined by the gap of the side wall 226. The electrons will accelerate and become heated and some of them will be injected into and through the first insulating layer 220 onto the floating gate 222.

The injection of electrons onto the floating gate 222 will continue until the charged floating gate 222 can no longer sustain a high surface potential beneath, to generate hot electrons. At that point, the electrons or the negative charges in the floating gate 222 will "turn off" the electrons from flowing from the source region 216 onto the floating gate 222.

Finally, in a read cycle, ground potential is applied to the source region 216. Conventional transistor read voltage, such as +2 volts and +5 volts, are applied to the drain region 214 and to the control gate 229, respectively. If the floating gate 222 is positively charged (i.e., the floating gate is discharged), then the channel region 218 directly beneath the floating gate 222 is turned on. When the control gate 229 is raised to the read potential, the region of the channel region 218 directly beneath the second portion 230 is also turned on. Thus, the entire channel region will be turned on, causing electrical current to flow from the drain region 214 to the source region 216. This would be the "1" state.

On the other hand, if the floating gate 222 is negatively charged, the channel region 218 directly beneath the floating gate 222 is either weakly turned on or is entirely shut off. Even when the control gate 229 and the drain region 214 are raised to the read potential, little or no current will flow through the portion of the channel region directly beneath the floating gate 222. In this case, either the current is very small compared to that of the "1" state or there is no current at all. In this manner, the cell 210 is sensed to be programmed at the "0" state.

Figure 7:
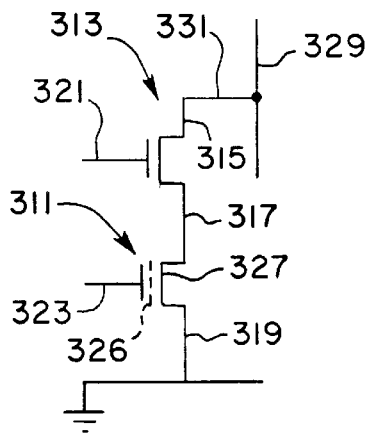

FIG. 7 is a schematic circuit diagram of a memory cell according to another specific embodiment of the present invention. With reference to FIG. 7, a memory cell of the present invention includes a memory device 311 and a field effect transistor 313 which allows selection of memory device 311 from among other memory cells. A drain 315 of selection transistor 313 is connected via a metal contact 331 to a read line 329. Selection transistor 313 and memory device 311 are connected together in series at a node 317 which serves as both a source for selection transistor 313 and a drain for memory device 311. A source 319 of memory device 311 connects to a common source line which in turn is coupled to ground. The gate 321 of selection transistor 313 is electrically connected to a word select line. The control gate 323 of memory device 311 is connected to a sense enable and program line. The circuit of FIG. 7 also includes in the memory device 311 a floating gate 326 (as represented in FIG. 7 by a dashed line), separated from the substrate by only a thin oxide layer. A program and erase implant 327 is provided in memory device 311 proximate to the device 317. The thin oxide layer together with the program and erase implant 327 permit rapid erasure of the memory device 311 electrically in a few milliseconds, instead of the usual twenty minutes or so with UV light with the thicker oxide layer under the floating gate of prior memory devices. The implant 327 also enables more efficient reprogramming to occur.

Figure 8:
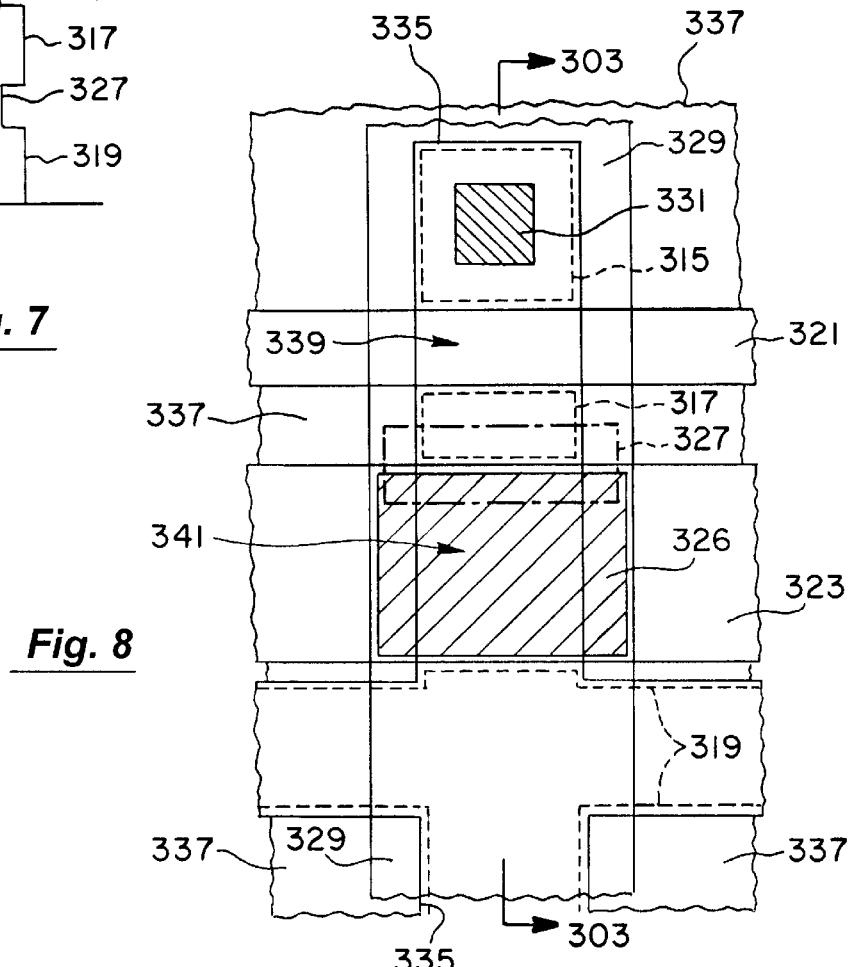
Figure 9:
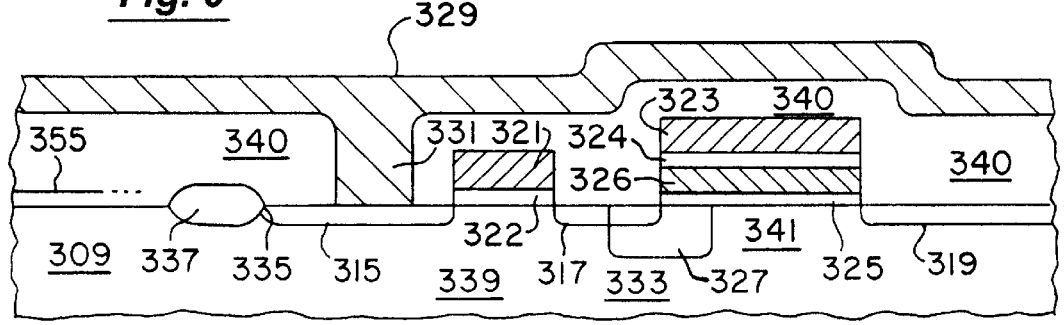

FIG. 8 is a top plan view of the memory cell of FIG. 7. FIG. 9 is a side sectional view taken along the line 303—303 in FIG. 8. With reference to FIGS. 8 and 9, a semiconductor chip having an array of memory cells comprises a semiconductor substrate 333 with active memory areas 335 therein. A field isolation oxide layer 337 is present over all nonactive areas outside of memory areas 335. Three spaced-apart implants 315, 317 and 319 are located in memory area 335 with channel areas 339 and 341 defined therebetween. Implant 315 forms a drain for the selection transistor 313 in the circuit of FIG. 7. Implant 317 forms a node functioning as both a source for selection transistor 313 and a drain for memory device 311 in FIG. 7. Implant 319 forms a source for memory device 311. Typically, substrate 333 is P-type and implants 315, 317 and 319 are N-type.

A program and erase implant 327 is also present in the active memory area 335 of substrate 333. Implant 327 overlaps part of node implant 317, extending into channel 341 between implants 317 and 319 of the memory device 311. Implant 327 is typically N-type and may be formed by either phosphorus or arsenic ion implantation followed by diffusion, as explained below. A thin oxinitride layer 325 is disposed over channel 341 between implants 317 and 319, including over the portion of program and erase implant 327 which extends into channel 341, in active area 335. Typically, thin oxinitride layer 325 is between 70 Angstrom and 150 Angstrom thick. The remainder of active area 335 between field isolation oxide layer 337 has an oxide layer 322 over it. Oxide layer 322 is thicker than thin oxinitride layer 325, typically about 300–500 Angstrom thick.

A polysilicon floating gate 326 is disposed on thin oxinitride layer 325 and extends over that portion of program and erase implant 327 that is beneath thin oxinitride layer 325. An interpoly oxide layer 324 is disposed on floating gate 326 and a polysilicon sense gate 323 is situated above interpoly oxide layer 324. A polysilicon select gate 321 is disposed above oxide layer 322 which overlies channel 339 between implants 315 and 317. The entire wafer is covered with an insulating glass layer 339 with vias for contacts 331 therein. A layer of conductive lines 329 is disposed on top of glass layer 340.

According to a specific embodiment of the invention as shown in FIGS. 7–9, the oxide layer 322 is substantially free from any nitrogen bearing compounds because it has been protected according to the present invention by a photomask during a nitrogen-introducing step (e.g., ion implantation or plasma treatment) associated with making of the thin oxinitride layer 325, similarly to the process discussed above with reference to previous figures.

In particular, similarly to what was discussed above with reference to previous figures, prior to the nitrogen-introducing step (e.g., a sacrificial oxide growth and removal step) associated with making the thin oxinitride layer 325, a masking layer is applied to cover active region 339. The masking layer can be made of any suitable photoresist layer for selectively protecting the active region 309 from a step of ion implantation or plasma treatment, which will be used to introduce the nitrogen bearing impurities. Active region 339 is protected from a possibility of any nitrogen bearing impurities, which can influence the quality and reliability of the transistor 313 being formed thereon according to the embodiment.

The ion implantation step (or plasma treatment step) introduces a nitrogen bearing impurity into the surface of the active region 341, which corresponds to the flash memory cell 311. In some embodiments, nitrogen gas is used as a source for the nitrogen bearing compound. Alternatively, other nitrogen bearing compounds such as NO, $N_2O$, and others can be used, depending upon the application. The nitrogen gas converts into a nitrogen ion, which is accelerated into the surface of the substrate. As merely an example, nitrogen implantation has parameters including a dose ranging from about $10^{13}$ to $10^{15}$ atoms/cm$^3$. Power corresponding to this dose can range from about 60 keV and less, or 40 keV and less. Nitrogen ions are preferably introduced into and through a sacrificial oxide layer overlying the substrate. Implant depth ranges from about 80 Angstroms to about 100 Angstroms, but is not limited to this range. Other techniques can also be used to introduce the nitrogen bearing impurity or compound. For example, plasma treatment can be used to introduce nitrogen into the surface of the substrate. After introducing the nitrogen into the substrate, the sacrificial oxide is stripped. Alternatively, the nitrogen is annealed into the substrate with oxygen to form silicon oxynitride or the like, which occurs after removing the photoresist layer. This process forms a layer of tunnel oxide or tunnel oxynitride having a thickness ranging from about 80 to about 100 Angstroms, but is not limited to this range of thicknesses.

The photoresist layer is stripped. The substrate has active cell region 341 and active select gate region 339. Active cell region 341 has an overlying layer 325 of silicon oxynitride, which is formed after removing the photoresist. The active select gate region 339 has an overlying oxide layer 322, which is also formed after removing the photoresist. Oxide layer can be the sacrificial oxide layer or a cleanly grown oxide layer. Oxide layer 322 is substantially free from any nitrogen bearing compounds since region 309 has been protected by a photomask during the previous step of introducing nitrogen bearing compound or impurity with masking.

According to another specific embodiment of the invention, as shown in FIG. 9, the shown portion of the field isolation oxide layer 337 isolates the memory cell 210 from an active region 309. An oxide layer 355 overlies active region 309. The oxide layer 355 is substantially free from any nitrogen bearing compounds because its underlying active region 309 has been protected according to the present invention by a photomask during a nitrogen-introducing step (e.g., ion implantation or plasma treatment) associated with making of the first layer, similarly to the process discussed above with reference to previous figures. According to this specific embodiment, the oxide layer 322 may or may not also have had its underlying active region 339 similarly protected according to the present invention by a photomask, as discussed in the previous paragraphs. If the active region 339 is also similarly protected, a single photomask step can be used to protect both active regions 339 and 309.

In particular, similarly to what was discussed above with reference to previous Figures, prior to the nitrogen-introducing step (e.g., a sacrificial oxide growth and removal step) associated with making the thin oxinitride layer 325, a masking layer is applied to cover active region 309 and at least a portion of the isolation oxide region 337 (and to cover active region 339 as well, according to an alternate embodiment which also protects the active region 339). The masking layer can be made of any suitable photoresist layer for selectively protecting the active region 309 from a step of ion implantation or plasma treatment, which will be used to introduce the nitrogen bearing impurities. Active region 309 (and also active region 339 in the alternate embodiment) is protected from a possibility of any nitrogen bearing impurities, which can influence the quality and reliability of MOS or CMOS transistors being formed thereon.

The ion implantation step (or plasma treatment step) introduces a nitrogen bearing impurity into the surface of the active region 341. In some embodiments, nitrogen gas is used as a source for the nitrogen bearing compound. Alternatively, other nitrogen bearing compounds such as NO, $N_2O$, and others can be used, depending upon the application. The nitrogen gas converts into a nitrogen ion, which is accelerated into the surface of the substrate. As merely an example, nitrogen implantation has parameters including a dose ranging from about $10^{13}$ to $10^{15}$ atoms/cm$^3$. Power corresponding to this dose can range from about 60 keV and less, or 40 keV and less. Nitrogen ions are preferably introduced into and through a sacrificial oxide layer overlying the substrate. Implant depth ranges from about 80 Angstroms to about 100 Angstroms, but is not limited to this range. Other techniques can also be used to introduce the nitrogen bearing impurity or compound. For example, plasma treatment can be used to introduce nitrogen into the surface of the substrate. After introducing the nitrogen into the substrate, the sacrificial oxide is stripped. Alternatively, the nitrogen is annealed into the substrate with oxygen to form silicon oxynitride or the like, which occurs after removing the photoresist layer. This process forms a layer of tunnel oxide or tunnel oxynitride having a thickness ranging from about 80 to about 100 Angstroms, but is not limited to this range of thicknesses.

The photoresist layer is stripped. The substrate has active regions 341 and 339 and active peripheral region, which may be not in the periphery of the integrated circuit. Active cell region 341 has an overlying layer 325 of silicon oxynitride, which is formed after removing the photoresist. At least a portion of peripheral cell region 309 has an overlying oxide layer 355, which can be the sacrificial oxide layer or a cleanly grown oxide layer. In at least the alternate embodiment, the oxide layer 322 also can be the sacrificial oxide layer or a cleanly grown oxide layer. Oxide layer 355 (and also oxide layer 322 in the alternate embodiment) is substantially free from any nitrogen bearing compounds since region 209 has been protected by a photomask during the previous step of introducing nitrogen bearing compound or impurity with masking.

Figure 10:
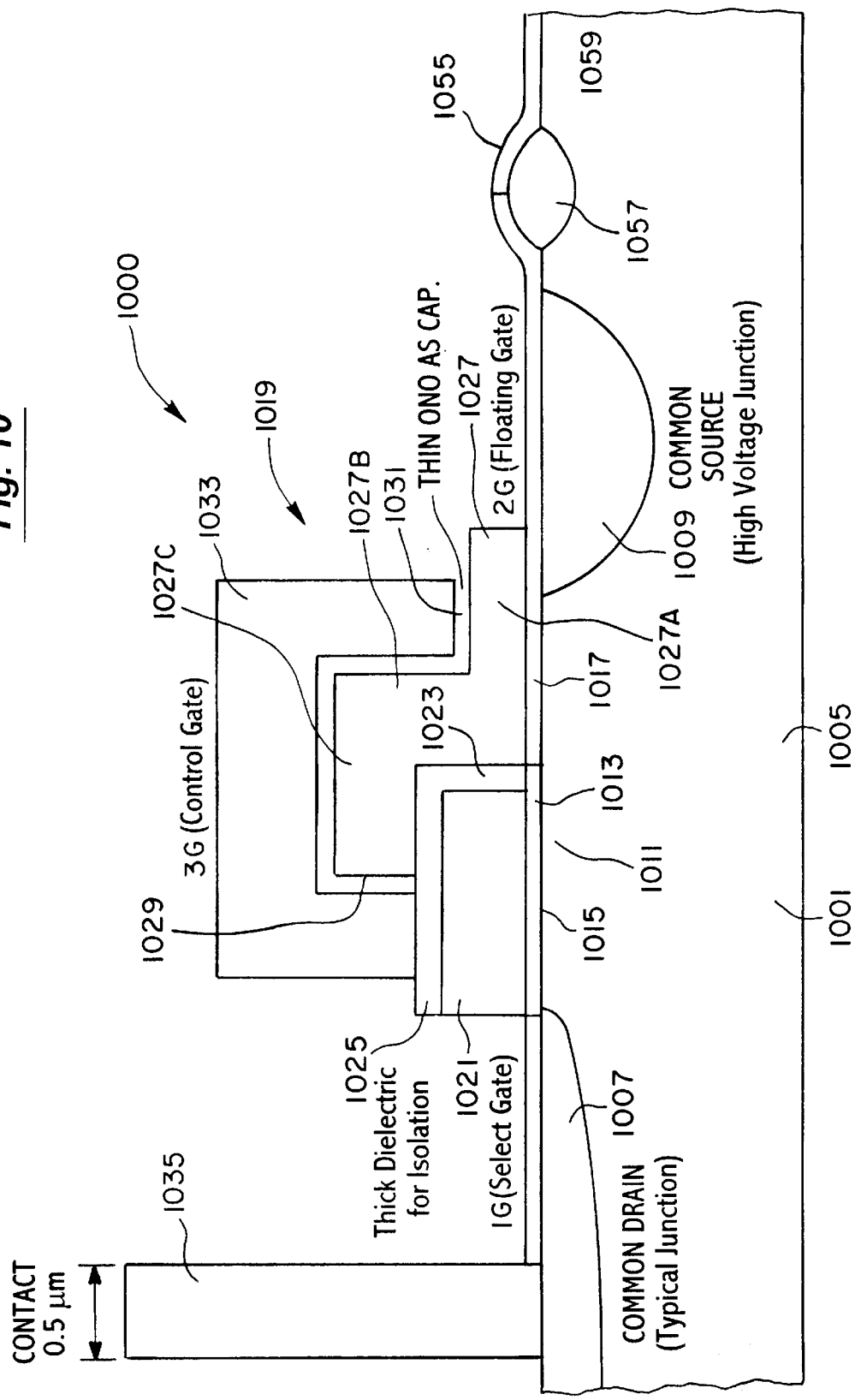

In a specific embodiment, the present invention can be applied to an improved flash memory cell 1000, such as the one shown in the simplified diagram of FIG. 10. This diagram is merely an illustration and should not limit the scope of the claims. One of ordinary skill in the art would recognize other variations, alternatives, and modifications. Memory cell 1000 is defined in substrate 1001, which includes an upper surface 1003 that is substantially planar in geometry. A well region 1005 is defined in the substrate. The well region 1005 has a drain region 1007 and a source region 1009. In some embodiments, the drain region is a common drain region, which is shared by another memory cell. Similarly, the source region can be a common source region, which is shared by another memory cell. Between the source region and the drain region is a channel region 1011. The source and drain regions are made using implantation techniques, but can also be made using plasma immersion ion implantation or the like. A dielectric layer 1013, including a gate dielectric layer 1015 and a tunnel dielectric layer 1017, is defined overlying the channel region 1011. These dielectric layers can be made using a suitable material including silicon dioxide, silicon nitride, silicon oxynitride, and others. In the context of this embodiment, the tunnel dielectric layer is made of silicon oxynitride. The tunnel dielectric layer is substantially uniform and substantially pinhole free. Additionally, the tunnel dielectric layer can withstand numerous programming and erase cycles.

The memory cell 1000 also includes a novel gate structure 1019. In particular, the gate structure 1019 includes a select gate 1021, which is defined from a first polysilicon layer, e.g., poly-1. The select gate is made from a polysilicon layer that is doped using N-type impurities. In some embodiments, the impurities are diffused using a $POCl_3$ compound or the like. Alternatively, the split gate can be in-situ doped using a phosphorous bearing compound or the like. In further embodiments, the polysilicon layer can be laid in an amorphous state, which is later crystallized, rather than the polycrystalline state. The amorphous state generally produces a smoother polysilicon layer. The select gate overlies gate oxide and extends to the drain region. A sidewall spacer 1023 and an overlying insulating layer 1025 are defined overlying the select gate. The sidewall spacer and the insulating layer insulate and isolate the select gate from overlying circuit elements, e.g, control gate, floating gate. The select gate also has a channel region ranging from about 0.2 micron and less or about 1.0 micron and less, but is not limited to these ranges. Additionally, the select gate has a thickness of about 500 Angstroms and less and about 3500 Angstroms and less, but is not limited to these ranges.

The gate structure 1019 also includes a split floating gate 1027 overlying a portion of the upper surface of the substantially planar substrate, and also overlaps a portion of the select gate, which is defined overlying the planar surface of the substrate. That is, the split floating gate is defined overlying insulating layer 1025, which forms overlying the top surface of the select gate. The split gate also overlies an edge(s) including sidewall spacer 1023 of the select gate.

The split gate 1027 also has an edge 1029 overlying a region on the top surface of the select gate 1021. Split floating gate 1027 also extends from the select gate to a region overlying tunnel dielectric layer 1017 and extends to source region 1009. Accordingly, the split gate has at least three regions, including a lower horizontal region 1027A overlying the planar surface (which includes the tunnel oxide and the source/drain region), a vertical region 1027B overlying an edge or sidewall spacer of the select gate, and an upper horizontal region 1027C overlying the top surface of the select gate. The lower horizontal region 1027A, the vertical region 1027B, and the upper horizontal region 1027C define the split gate structure.

The split gate 1027 can be made of any suitable material such as, for example, polysilicon, e.g., poly-2. In most embodiments, the split gate is made from a polysilicon layer that is doped using N-type impurities. In some embodiments, the impurities are diffused using a $POCl_3$ compound or the like. Alternatively, the floating gate can be in-situ doped using a phosphorous bearing compound or the like. In further embodiments, the polysilicon layer can be laid in an amorphous state, which is later crystallized, rather than the polycrystalline state. The amorphous state generally produces a smoother polysilicon layer.

A dielectric layer(s) 1031 is defined overlying the floating gate. The dielectric layer forms along edges of the floating gate, which are over the select gate. Additionally, the dielectric layer overlies the top surface of the upper horizontal region, overlies an outer surface of the vertical region, and extends over the lower horizontal region of the floating gate structure. Of course, the type of dielectric layer used depends highly upon the size and shape of the floating gate and control gate. The dielectric layer 1031 can be any suitable layer or combinations of layers such as an oxide-on-nitride-on-oxide, which is commonly termed "ONO." The dielectric layer can also be a single nitride layer or a single oxide layer depending upon the application. Either CVD or thermal techniques can be used to form the dielectric layer or layers. The dielectric layer insulates and isolates the floating gate from a control gate 1033.

Control gate 1033 forms overlying the dielectric layer 1031, which is sandwiched between the floating gate and the control gate. The control gate is defined overlying edge 1029 of the floating gate, which is over a top portion of the select gate. The control gate also forms overlying the upper horizontal region, the vertical region, and the lower horizontal region of the floating gate. The control gate can be made of any suitable material such as, for example, polysilicon, e.g., poly-3. In most embodiments, the control gate is made from a polysilicon layer that is doped using N-type impurities. In some embodiments, the impurities are diffused using a $POCl_3$ compound or the like. Alternatively, the control gate can be in-situ doped using a phosphorous bearing compound or the like. In further embodiments, the polysilicon layer can be laid in an amorphous state, which is later crystallized, rather than the polycrystalline state. The amorphous state generally produces a smoother polysilicon layer.

A contact 1035 is defined overlying the drain region. Contacts are also defined on the select gate, the control gate, and the source region. These contacts can be made using a variety of techniques. For example, the contacts can be made using a combination of metals such as aluminum with a barrier metal such as titanium nitride, titanium tungsten, and others. Alternatively, the contacts can be made using a tungsten layer or copper layer with a barrier metal. Furthermore, the contacts can be made from "plugs" such as tungsten plugs, polysilicon plugs, aluminum plugs, and the like. The plugs can be used with or without a barrier layer, or can also be grown in a selective manner. Of course, the type of contacts used depends highly upon the application.

In the present embodiment, the gate coupling ratio or GCR is increased by way of the present novel transistor design. GCR increases by increasing the area of the floating gate that is capacitively coupled to the control gate relative to the area of the floating gate that is capacitively coupled to the tunnel oxide overlying the active cell region. As shown, the control gate couples to the floating gate through exposed surfaces of edge 1029, upper horizontal region 1027C, and vertical region 1027B. Floating gate couples to the tunnel oxide through the lower horizontal region 1027A. Accordingly, control gate couples to the floating gate through at least two additional surface regions. Ideally, GCR approaches one in embodiments of the present invention. Practically, however, it is quite difficult for GCR to equal one. Accordingly, GCR ranges from values greater than 0.3, or greater than 0.5, or greater than 0.6, or greater than 0.8 in the embodiments of the present invention, although GCR is not limited to these values. The exact value of GCR depends upon the particular geometric configuration of the floating gate as well as the design rule of the device. Of course, the final GCR value will depend upon the particular application.

In a specific embodiment, the present memory cell can be programed and erased by placing voltages on selected gate structures. To program the floating gate or add electrons to the floating gate, selected voltages are applied to the gate structures and source/drain regions. Electrons migrate from the source region through the channel region and inject through the tunnel oxide layer to the floating gate, where electron charge builds up. To erase the floating gate or remove electrons from the floating gate, selected voltages are applied to the gate structures and the source/drain regions. Electrons migrate from the floating gate through the tunnel oxide layer to the channel region and out through the drain region.

The embodiment described above is merely a single flash memory device with a novel gate structure. Integrated circuits include one or more of these devices in a cell. Thousands, millions, billions, and even trillions of these devices are formed in a single integrated circuit chip. Thus, the integrated circuit chip can have 4 Meg., 16 Meg. 64 Meg. 256 Meg., 1 Gig. or more devices on a single sliver of silicon. The channel length of these devices range from about 0.4 μm to 0.25 μm and less. The flash memory device can be formed in a stand alone integrated circuit chip, commonly termed the FLASH memory chip, in some embodiments. Alternatively, the flash memory device can be integrated into a microprocessor, microcomputer, digital signal processor, application specific integrated circuit, and the like. Of course, the number of cells and design size depend highly upon the application.

As shown in FIG. 10, an isolation oxide 1057 isolates the memory cell 1000 from an active region 1059. An oxide layer 1055 overlies active region 1059. The oxide layer 1055 is substantially free from any nitrogen bearing compounds because its underlying active region 1059 has been protected according to the present invention by a photomask during a nitrogen-introducing step (e.g., ion implantation or plasma treatment) associated with making the tunnel dielectric layer 1017, similarly to the process discussed above with reference to previous figures.

In particular, similarly to what was discussed above with reference to previous figures, prior to the nitrogen-introducing step associated with making the tunnel dielectric layer 1017, a masking layer is applied to cover active region 1059 and a portion of the isolation oxide region 1057. The masking layer can be made of any suitable photoresist layer for selectively protecting the active region 1059 from a step of ion implantation or plasma treatment, which will be used to introduce the nitrogen bearing impurities. Active region 1059 is protected from a possibility of any nitrogen bearing impurities, which can influence the quality and reliability of MOS or CMOS transistors being formed thereon.

The ion implantation step (or plasma treatment step) introduces a nitrogen bearing impurity into at least the portion of the surface of the active region 1011 which underlies the horizontal region 1027A. In some embodiments, nitrogen gas is used as a source for the nitrogen bearing compound. Alternatively, other nitrogen bearing compounds such as NO, $N_2O$, and others can be used, depending upon the application. The nitrogen gas converts into a nitrogen ion, which is accelerated into the surface of the substrate. As merely an example, nitrogen implantation has parameters including a dose ranging from about $10^{13}$ to $10^{15}$ atoms/cm$^3$. Power corresponding to this dose can range from about 60 keV and less, or 40 keV and less. Nitrogen ions are preferably introduced into and through a sacrificial oxide layer overlying the substrate. Implant depth ranges from about 80 Angstroms to about 100 Angstroms, but is not limited to this range. Other techniques can also be used to introduce the nitrogen bearing impurity or compound. For example, plasma treatment can be used to introduce nitrogen into the surface of the substrate. After introducing the nitrogen into the substrate, the sacrificial oxide is stripped. Alternatively, the nitrogen is annealed into the substrate with oxygen to form silicon oxynitride or the like, which occurs after removing the photoresist layer. This process forms a layer of tunnel oxide or tunnel oxynitride having a thickness ranging from about 80 to about 100 Angstroms, but is not limited to this range of thicknesses.

The photoresist layer is stripped. The substrate has active cell region 1011 and active peripheral region 1059, which may be not in the periphery of the integrated circuit. A portion of active cell region 1011 has an overlying layer 1017 of silicon oxynitride, which is formed after removing the photoresist. At least a portion of peripheral cell region 1059 has an overlying oxide layer 1055, which can be the sacrificial oxide layer or a cleanly grown oxide layer. Oxide layer 1055 is substantially free from any nitrogen bearing compounds since the active region 1059 has been protected by a photomask during the previous step of introducing nitrogen bearing compound or impurity with masking.

Although the above descriptions have been described in terms of, e.g., a general stacked gate flash memory cell, a variety of other flash memory cells can be used. For example, the present invention can be applied to cells using processes called FETMOX, SIMOS, and others. Of course, the type of cell or process used depends upon the application.

While the above is a full description of the specific embodiments, various modifications, alternative constructions, and equivalents may be used. For example, while the description above is in terms generally to a flash memory structure, it would be possible to implement the present invention in embedded structures. For example, these embedded structures include, among others, microprocessors, microcontrollers, and the like. Additionally, the flash memory structure can be integrated into an application specific integrated circuit ("ASIC") or the like.

Therefore, the above description and illustrations should not be taken as limiting the scope of the present invention which is defined by the appended claims.

What is claimed is:

1. A method of fabricating a flash memory device, said method comprising steps of:

providing a semiconductor substrate comprising a first active region, a second active region, and an isolation region, said isolation region being defined between said first active region and said second active region;

masking a portion of said isolation region and said second active region;

introducing a nitrogen beating impurity into a surface of said first active region, said mask substantially protecting said second active region from said nitrogen bearing impurities;

removing said portion being masked; and forming a silicon oxynitride layer from said nitrogen bearing impurity on said surface of said first active region and forming silicon dioxide on said second active region.

2. The method of claim 1 wherein said active region is a cell region for a flash memory device.

3. The method of claim 1 further comprising a step of forming a floating gate layer overlying said silicon oxynitride layer.

4. The method of claim 1 further comprising steps of:

forming a floating gate layer overlying said silicon oxynitride layer;

forming a dielectric layer overlying said floating gate layer; and forming a control gate layer overlying said dielectric layer.

5. The method of claim 1 wherein said nitrogen bearing impurity is derived from nitrogen gas.

6. The method of claim 1 wherein said masking step comprises providing a photoresist layer.

7. The method of claim 1 wherein said silicon oxynitride layer is a tunnel layer.

8. The method of claim 1 wherein said step of forming said silicon oxynitride layer and said step of forming said silicon dioxide layer provide a region between said isolation region and said second active region that is substantially uniform layer of said silicon dioxide layer.

9. The method of claim 1 wherein said introducing step is provided by an ion implantation device.

10. A method of fabricating an integrated circuit, said method comprising steps of:

providing a semiconductor substrate comprising a first active region, a second active region, and an isolation region, said isolation region being defined between said first active region and said second active region, said first active region corresponding to a flash memory cell, and said second region corresponding to a thin film MOS device;

masking a portion of said second active region and introducing a nitrogen bearing impurity into a surface of said first active region;

removing said portion being masked; and forming a silicon oxynitride layer from said nitrogen bearing impurity on said surface of said first active region;

wherein said second active region is substantially free from any nitrogen bearing impurities to prevent a possibility of any Kooi influence on said second active region during a subsequent thermal treatment process.

11. The method of claim 10 further comprising a step of forming a floating gate layer overlying said silicon oxynitride layer.

12. The method of claim 10 further comprising steps of:

forming a floating gate layer overlying said silicon oxynitride layer;

forming a dielectric layer overlying said floating gate layer; and forming a control gate layer overlying said dielectric layer.

13. The method of claim 10 wherein said nitrogen bearing impurity is derived from nitrogen gas.

14. The method of claim 10 wherein said masking step comprises providing a photoresist layer.

15. The method of claim 10 wherein said silicon oxynitride layer is a tunnel layer.

16. The method of claim 10 wherein said second active region includes a substantially uniform layer of silicon dioxide.

17. The method of claim 10 wherein said introducing step is provided by an ion implantation device.

* * * * *